United States Patent [19]

Wada et al.

[11] Patent Number: 6,144,080
[45] Date of Patent: *Nov. 7, 2000

[54] SEMICONDUCTOR INTEGRATED CIRCUIT DEVICE HAVING FIELD SHIELD MOS DEVICES

[75] Inventors: Toshio Wada; Yoji Hata, both of Tateyama, Japan

[73] Assignee: Nippon Steel Semiconductor Corporation, Tateyama, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/639,750

[22] Filed: Apr. 29, 1996

[30] Foreign Application Priority Data

May 10, 1995 [JP] Japan ................................ 7-111891

[51] Int. Cl.[7] .......................... H01L 29/76; H01L 29/94; H01L 31/062; H01L 31/113
[52] U.S. Cl. ......................... 257/394; 257/369; 257/488; 257/491
[58] Field of Search ................................... 257/369, 394, 257/488, 491

[56] References Cited

U.S. PATENT DOCUMENTS

| | | | |
|---|---|---|---|
| 3,811,076 | 5/1974 | Smith, Jr. ................................ | 257/296 |
| 4,200,892 | 4/1980 | Weimer .................................. | 358/213 |
| 4,994,893 | 2/1991 | Ozaki et al. ............................ | 357/68 |
| 5,164,803 | 11/1992 | Ozaki et al. ........................... | 257/372 |
| 5,181,094 | 1/1993 | Eimori et al. .......................... | 257/372 |
| 5,321,293 | 6/1994 | Mojaradi et al. ....................... | 257/369 |
| 5,341,009 | 8/1994 | Young et al. ........................... | 257/296 |
| 5,386,151 | 1/1995 | Folmsbee ................................ | 327/536 |
| 5,629,540 | 5/1997 | Roh et al. .............................. | 257/306 |
| 5,635,744 | 6/1997 | Hidaka et al. ......................... | 257/349 |

FOREIGN PATENT DOCUMENTS

| | | |
|---|---|---|
| 61-248459 | 11/1986 | Japan . |
| 2-094455 | 4/1990 | Japan . |
| 4-61254 | 2/1992 | Japan . |
| 6-91220 | 11/1994 | Japan . |

*Primary Examiner*—Olik Chaudhuri
*Assistant Examiner*—Howard Weiss
*Attorney, Agent, or Firm*—Oblon, Spivak, McClelland, Maier & Neustadt, P.C.

[57] ABSTRACT

A semiconductor integrated circuit has P-channel active MOSFETs and N-channel active MOSFETs formed in a semiconductor substrate. In order to electrically isolate the active MOSFETs, the semiconductor integrated circuit has P-channel field shield MOS devices and N-channel field shield MOS devices. The P-channel field shield MOS devices have field shield electrodes which are laid on regions between impurity diffusion regions of the P-channel active MOSFETs. The N-channel field shield MOS devices have field shield electrodes which are laid on regions between impurity diffusion regions of N-channel active MOSFETs. A P-channel field shield voltage, which is higher than a power supply voltage of the semiconductor integrated circuit, is supplied to the field shield electrodes of the P-channel field shield MOS device to turn the P-channel field shield MOS devices to an OFF-state to electrically isolate the P-channel active MOSFETs. An N-channel field shield voltage, which is lower than a ground level of the semiconductor integrated circuit, is supplied to the field shield electrodes of the N-channel field shield MOS devices to turn the N-channel field shield MOS devices to an OFF-state to electrically isolate the N-channel active MOSFETs.

7 Claims, 7 Drawing Sheets

6,144,080

SEMICONDUCTOR INTEGRATED CIRCUIT DEVICE HAVING FIELD SHIELD MOS DEVICES

BACKGROUND OF THE INVENTION

1. Field of the Invention

The present invention relates to a semiconductor integrated circuit using a field shield isolating technique.

2. Background Art

Generally, semiconductor integrated circuits have a plurality of active devices such as MOSFETs (Metal Oxide Semiconductor Field Effect Transistors) and these active transistors must be electrically isolated from each other. Therefore, thermally oxidized thick silicon films to isolate the active transistors are selectively formed on a portion of silicon substrate of semiconductor integrated circuit devices by a LOCOS (Local Oxidation of Silicon) method. According to the LOCOS method, it is possible to form thermally oxidized thick films on desired regions of the semiconductor substrate. In the LOCOS method, however, the thermally oxidized thick films develop along the surface of the semiconductor substrate and the circumference of the films form "bird's beaks". The "bird's beaks" can hinder the ability to produce fine-dimension semiconductor integrated circuit devices.

Recently, a field shield isolating technique is proposed as a technique for isolating the active devices of semiconductor integrated circuits, instead of the LOCOS method.

FIG. 7 shows a cross section of an example of CMOS integrated circuit device using the field shield isolating technique.

In FIG. 7, a P-substrate 1 is a semiconductor substrate in which p-type impurities are doped at a low density. An N-well 2 is a region of the P-substrate 1 in which N-type impurities are doped at a low density.

P-channel active MOSFETs 5 are formed in the N-well 2. Each one of the P-channel active MOSFETs has source and drain diffusion regions which are formed in the N-well 2 and are designated by reference numerals 3 and 4. These diffusion regions are $P^+$-regions in which P-type impurities are doped at high density.

Field shield electrodes 6 are formed on device isolating regions which exist between the source or drain regions 3, 4 of the P-channel active MOSFETs. The field shield electrodes 6 and the surface of the N-well 2 constitute P-channel field shield MOS devices for isolating the P-channel active MOSFETs.

On the other hand, N-channel active MOSFETs 9 are formed in the P-substrate 1. Each one of the N-channel active MOSFETs has source and drain diffusion regions which are designated by reference numerals 7 and 8. These diffusion regions are $N^+$-regions in which N-type impurities are doped at a high density.

Field shield electrodes 10 are formed on device isolation regions which exist between the source or drain regions of the N-channel MOSFETs. The field shield electrodes 10 and the surface of the P-substrate 1 constitute N channel field shield MOS devices for isolating the N channel active MOSFETs.

Power supply voltage $V_{DD}$ (for example, $V_{DD}$=5V) is supplied to the field shield electrodes 6 on the N-well 2. Ground level voltage GND is supplied to the field shield electrodes 10 on the P-substrate 1.

Therefore, the field shield MOS devices constituted by these field shield electrodes are OFF-states.

In this CMOS integrated circuit device, there are PN junctions between the source or drain diffusion regions of the active MOSFETs 5 and 9, and counter bias voltages are given to the PN junctions. The resistances of the PN junctions are enhanced by the voltages of the field shield electrodes 6 and 10, so that the active MOSFETs are electrically isolated by the PN junctions.

More specifically, the voltage of the P-channel field shield electrode attracts electrons in the N-well 2. As a result, the electrons are accumulated in the device isolating regions of the N-well 5 which are covered by the field shield electrodes 6 and are inserted between the source and drain diffusion regions of the P-channel MOSFETs 5. Thus, the device isolating regions are changed to $N^+$-diffusion regions which contain high density N-type carriers. Therefore, $P^+$-$N^+$-$P^+$ junctions, which have very high resistances, are formed between the source and drain diffusion regions of the P-channel active MOSFETs 5 and the P-channel active MOSFETs are electrically isolated by the junctions.

On the other hand, the voltage of the N-channel field shield electrode attracts holes in the P-substrate 1. As a result, holes are accumulated in the device isolating regions of the P-substrate 1 which are covered by the field shield electrodes 10 and are inserted between the source and drain diffusion regions of the N-channel active MOSFETs 9. Thus, the device isolating regions are changed to $P^+$-diffusion regions which contain high density P-type carriers. Therefore, $N^+$-$P^+$-$N^+$ junctions, which have very high resistances, are formed between the source and drain diffusion regions of the N-channel active MOSFETs 9 and the N-channel MOSFETs are electrically isolated by the junctions.

In this CMOS integrated circuit, the source or drain diffusion regions of the neighboring P-channel MOSFETs 5 and the field shield electrodes 6 inserted between the diffusion regions constitute P-channel MOSFETs. On the other hand, the source or drain diffusion regions of the neighboring N-channel MOSFETs 9 and the field shield electrodes 10 inserted between the diffusion regions constitute N-channel MOSFETs. These MOSFETs thus constituted have a threshold voltage level $V_T$.

The voltage levels of the gate electrodes of the P-channel MOSFETs (i.e., the field shield electrodes) are fixed at $V_{DD}$. The voltage levels of the gate electrodes of the N-channel MOSFETs (i.e., the field shield electrodes) are fixed at GND. Therefore, if the voltage levels of the source and drain diffusion regions are GND-$V_T$~$V_{DD}$+$V_T$, the MOSFETs constituted by the field shield electrodes remain in an OFF-state.

However, in the case where the voltage level of the source or drain diffusion regions in the N-well 2 become higher than the upper limit level $V_{DD}$+$V_T$, the P-channel MOSFETs constituted by the field shield electrodes 6 are changed to an ON-state. Furthermore, in the case where the voltage level of the source or drain diffusion regions in the P-type substrate 1 become lower than the lower limit level GND-$V_T$, the N-channel MOSFETs constituted by the field shield electrodes 10 are changed to an ON-state. Therefore, it is impossible to isolate the MOSFETs 5 and 9 in these cases.

Generally, integrated circuits such as DRAMs have a large number of active transistors. The waveforms of the output signals of the transistors depend on circuit factors of the integrated circuit, for example, the operational frequency of the transistors and the load capacitors. Therefore, an over-shoot or an under-shoot of the signal waveforms often occurs due to t he circuit factors and the amplitudes of the signal waveforms in the integrated circuit may approach or exceed the above-described upper or lower limit level. This obstructs the isolation of the active transistors.

Furthermore, in the above-described CMOS integrated circuit, a current having a very small value flows through each MOSFET constituted by the field shield electrode even if the difference voltage between the field shield electrode and the source or drain diffusion regions is less than the threshold level $V_T$ and the isolation is sufficiently achieved. In large-scaled integrated circuits, a large number of active MOSFETs are provided. Therefore, a large number of field shield electrodes are necessary to isolate the MOSFETs on the large-scaled integrated circuit. The current of the MOSFETs constituted by each field shield electrode is very small and this current constitutes a part of a consumption current of the integrated circuit. However, the total current of these MOSFETs exert an influence on the electric characteristics (AC and DC characteristics) of the integrated circuit. For example, such a current exerts an influence on an accumulated carrier of memory cells provided on the integrated circuit.

Furthermore, if the isolation of the MOSFETs is not sufficiently achieved in memory devices such as a DRAM, leakage currents of memory cell capacitors are increased and the stored information may be lost in a short time. In order to overcome the loss of stored information, it is necessary to refresh the information stored in the memory at a higher frequency. This causes an increase in the consumption of current by the memory. Therefore, an improvement in the device isolating technique is required.

Japanese Patent Application, Second Publication, No. Hei 6-91220 discloses a device isolation technique for sufficiently isolating MOSFETs. In this technique, field shield MOS devices having a higher threshold levels $V_T$ are provided in order to improve the above-described upper and lower limit levels. In order to increase the threshold levels $V_T$, the oxide film under the field shield electrodes is made thicker than the thickness of the gate oxide films of the active MOSFETs to enhance a body effect to the field shield MOS devices.

In this technique, however, the thickness of the whole integrated circuit device becomes larger. This causes a problem in that a step-coverage of upper layers of the field shield electrode layer is degraded. This problem obstructs the achievement of production of a fine dimension integrated circuit device.

SUMMARY OF THE INVENTION

The present invention was created in light of the above circumstances, and it has as an object thereof to provide a semiconductor integrated circuit, the active transistor of which can be sufficiently isolated even if signals having an over-shoot or an under-shoot are generated in the integrated circuit.

In order to achieve the above object, the present invention provides a semiconductor integrated circuit device having active transistors formed in a semiconductor substrate. The semiconductor integrated circuit comprises field shield MOS devices having field shield electrodes laid upon a region of the substrate between impurity diffusion regions of the active transistors. A field shield voltage is supplied to the field shield electrodes to turn the field shield MOS devices to an OFF-state to electrically isolate the active transistors. The voltage level of the field shield electrodes is shifted from a range of a operation voltage of the active transistors.

The present invention further provides a semiconductor integrated circuit device having P-channel active MOSFETs and N-channel active MOSFETs formed in a semiconductor substrate. The semiconductor integrated circuit device comprises P-channel field shield MOS devices for electrically isolating the P-channel active MOSFETs, the P-channel field shield MOS devices having field shield electrodes laid on regions between impurity diffusion regions of the P-channel active MOSFETs, N-channel field shield MOS devices for electrically isolating the N-channel active MOSFETs, the N-channel field shield MOS devices having field shield electrodes laid on regions between impurity diffusion regions of N-channel active MOSFETs. A P-channel field shield voltage, which is higher than a power supply voltage of the semiconductor integrated circuit, is supplied to the field shield electrodes of the P-channel field shield MOS device to make the P-channel field shield MOS devices an OFF-state to electrically isolate the P-channel active MOSFETs. An N-channel field shield voltage, which is lower than a ground level of the semiconductor integrated circuit, is supplied to the field shield electrodes of the N-channel field shield MOS devices to turn the N-channel field shield MOS devices to an OFF-state to electrically isolate the N-channel active MOSFETs.

DETAILED DESCRIPTION OF THE PREFERRED EMBODIMENTS

Hereinbelow, a preferred embodiment of the present invention will be explained with reference to the drawings. The preferred embodiments of the present invention relate to a DRAM which is constructed by CMOS transistors.

First Preferred Embodiment

Figure 1:
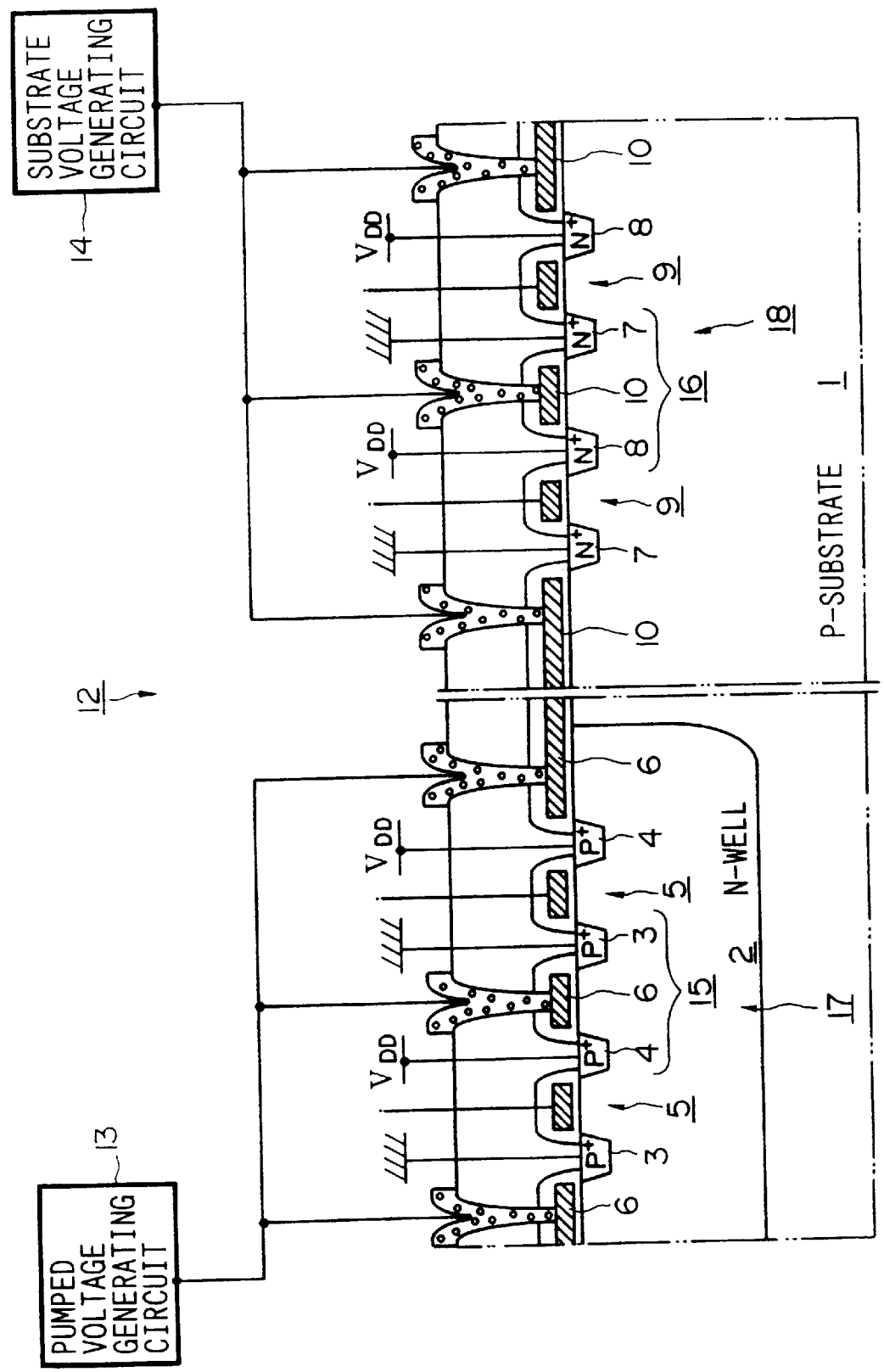
FIG. 1 shows a section view of a semiconductor integrated circuit device according to a first preferred embodiment of the present invention.
Figure 7:
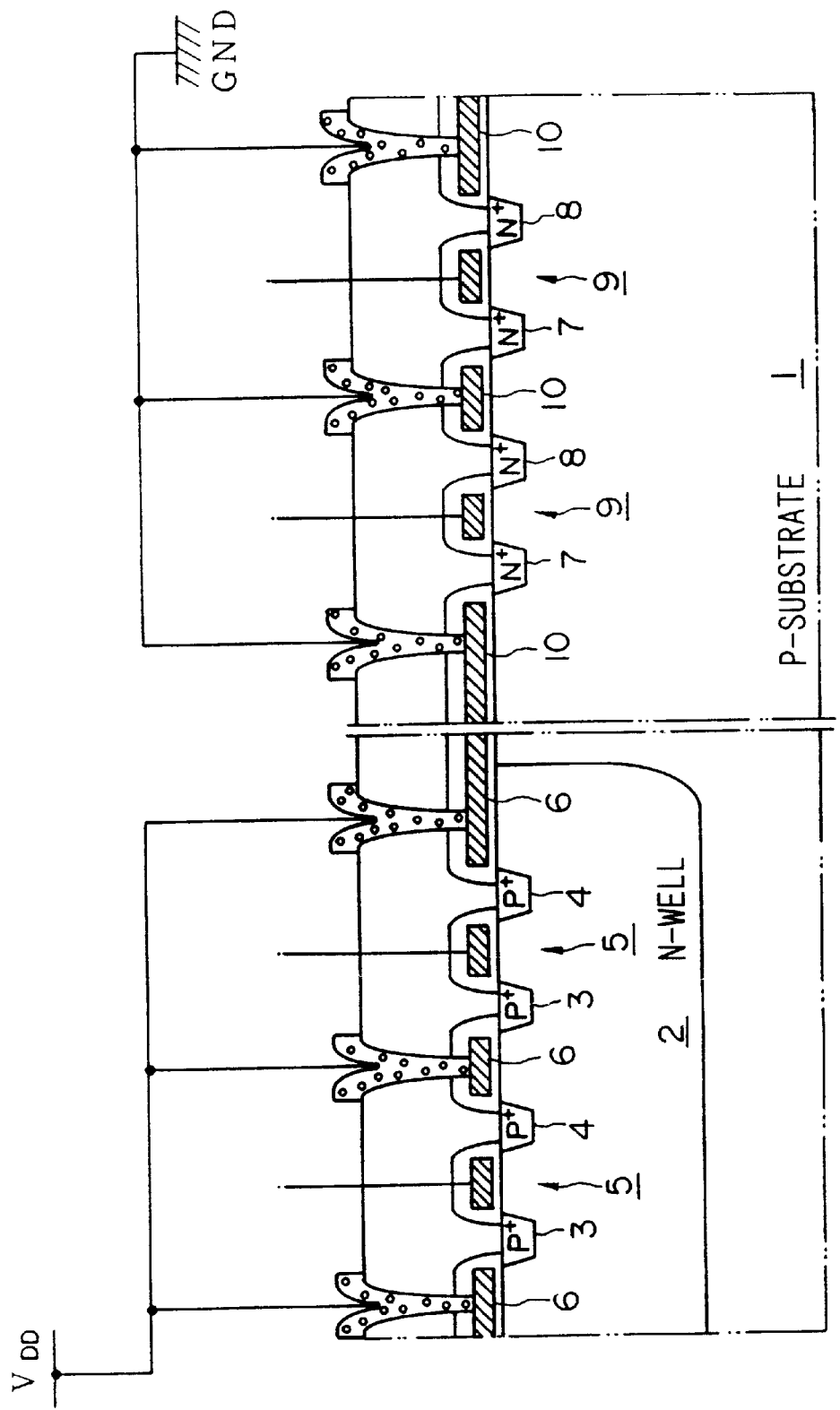
FIG. 7 shows a section view of a prior art semiconductor integrated circuit device using a field shield isolating technique.

FIG. 1 shows a sectional view of a semiconductor integrated circuit device 12 in which a DRAM circuit and devices for isolating the active transistors of the circuit is formed. In FIG. 1, the members which are identical to those of the prior art are designated by the same reference numerals as of the prior art shown in FIG. 7 and then the description thereof will be omitted.

In this preferred embodiment, the field shield electrodes 6 are provided on P-channel device isolating regions 17 and the field shield electrodes are connected to a pumped voltage generating circuit 13. The field shield electrodes 6 and the surface of the N-well 2 constitute P-channel field shield MOS devices 15.

The original role of the pumped voltage generating circuit 13 is to drive the word lines and the output buffers of the DRAM. The pumped voltage generating circuit 13 can generate a pumped voltage, the value of which is $V_{DD}+\alpha$. In this embodiment, $\alpha=2V_{tn}$ ($V_{tn}$ is a threshold voltage of N-channel active MOSFET). Therefore, if $V_{DD}$=5V and $V_{tn}$=0.7v, the pumped voltage is 5V+2×0.7V=6.4V. This pumped voltage is supplied to the field shield electrodes 6.

On the other hand, the field shield electrodes 10 are provided on N-channel device isolating regions 18 and the field shield electrodes are connected to a substrate voltage generating circuit 14. The field shield electrodes 10 and the surface of the P-substrate 1 constitute N-channel field shield MOS devices 16.

The original role of the substrate voltage generating circuit 14 is to supply a voltage GND-β to the P-substrate 1. In this embodiment, the GND-β is set as $-V_{DD}/2$. This voltage of $-V_{DD}/2$ is also supplied to the field shield electrodes 10. In this preferred embodiment, the voltage $-V_{DD}/2$=−2.5V is supplied to the P-substrate 1 and the field shield electrodes 10.

Suppose that the P-channel field shield MOS devices 15 have a threshold voltage of −2V. If the voltage levels of the field shield electrodes 6 are fixed at $V_{DD}$(=5V) as the above-described prior art, the field shield MOS devices 15 become ON-state when a signal waveform having an over-shoot is generated in this integrated circuit device 12 and the voltage level of the source or drain diffusion region thereby exceeds an upper limit voltage of 7V.

In the preferred embodiment, the voltage levels of the field shield electrodes 6 of the P-channel field shield MOS-FETs 15 are pumped to 6.4V by the pumped voltage generating circuit 13. Therefore, the upper limit voltage is increased to 6.4V+2V=8.4V and the field shield MOSFETs 15 turns to an ON-state when the voltage level of the source or drain diffusion region exceeds the upper limit voltage thus increased.

On the other hand, the voltage levels of the field shield electrodes 10 of the N-channel field shield MOSFETs 16 are fixed at −2.5V by the substrate voltage generating circuit 14. Therefore, the lower limit voltage, at which the ON/OFF state of an N-channel field shield MOSFET is switched, is changed from −2V to −4.5V.

Second Preferred Embodiment

If the device density of the integrated circuit device is high and the circuit on the integrated circuit device operates at a high frequency, a noise having a high frequency and a high amplitude is induced in the output voltage level of reference voltage generating circuits provided on the integrated circuit device, for example, the above-described substrate voltage generating circuit 14.

For example, if the active N-channel MOSFETs in the P-substrate 1 operate at a high frequency, currents flow between the sources and drains of the MOSFETs as well as currents are introduced into the P-substrate. As a result, the level $V_{BB}$ of the P-substrate 1 is varied.

In the preferred embodiment, a countermeasure is considered so that the isolation effects of the field shield MOSFETs are not obstructed by the variation of the substrate level $V_{BB}$.

Figure 2:
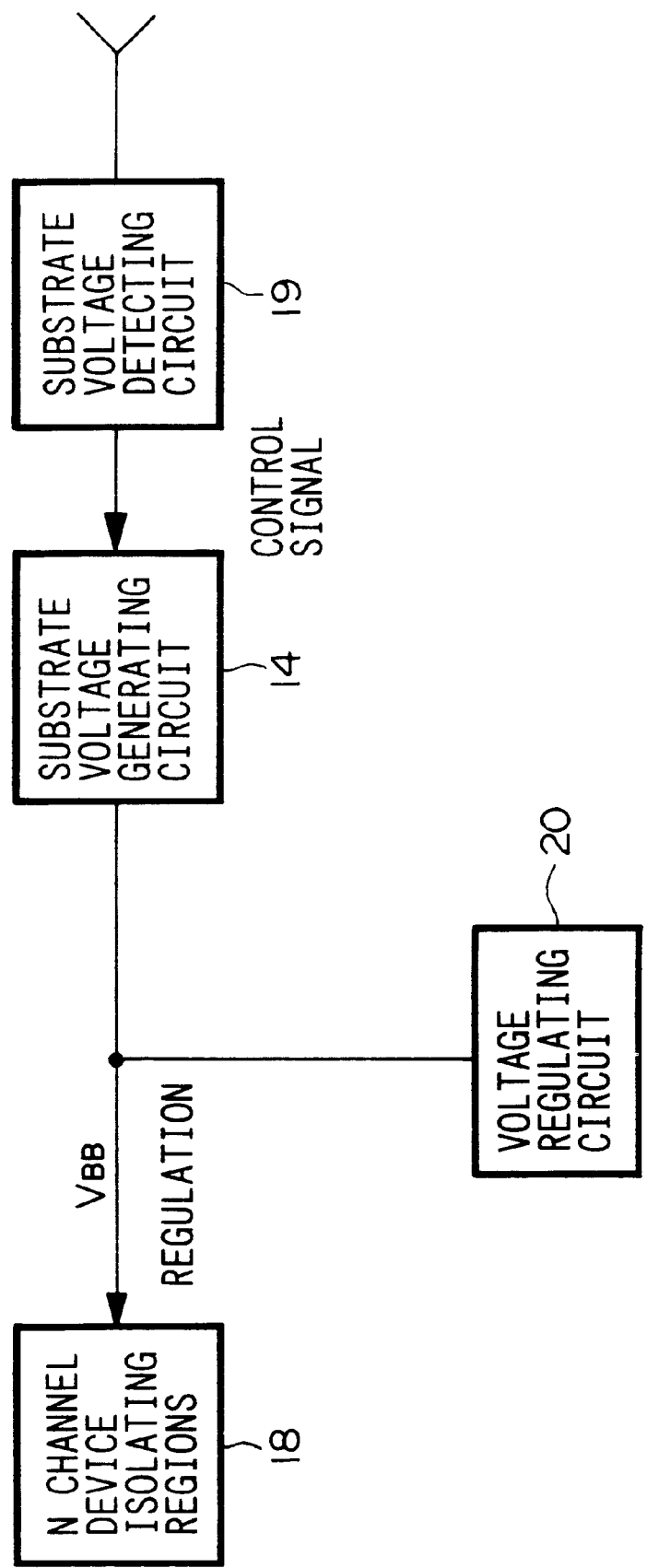
FIG. 2 is a block diagram showing a circuit configuration of a second preferred embodiment of the present invention.

In the preferred embodiment, some elements are connected to the substrate voltage generating circuit 14 as shown in FIG. 2 so that the sufficient isolation effects are obtained from the N-channel field shield MOS devices.

In FIG. 2, a substrate level detecting circuit 19 detects the substrate level $V_{BB}$ and outputs a control signal indicating the detected level $V_{BB}$. The output voltage of the substrate voltage generating circuit 14 is controlled in a constant voltage based on the control signal from the substrate level detecting circuit 19. Furthermore, a voltage regulating circuit 20 is connected to the output terminal of the substrate voltage generating circuit 14. The output voltage of the substrate voltage generating circuit 14 is regulated by the voltage regulating circuit 20. The voltage $V_{BB}$ thus regulated is supplied to the P-substrate 1 and the N-channel device isolating regions 18.

Figure 3:
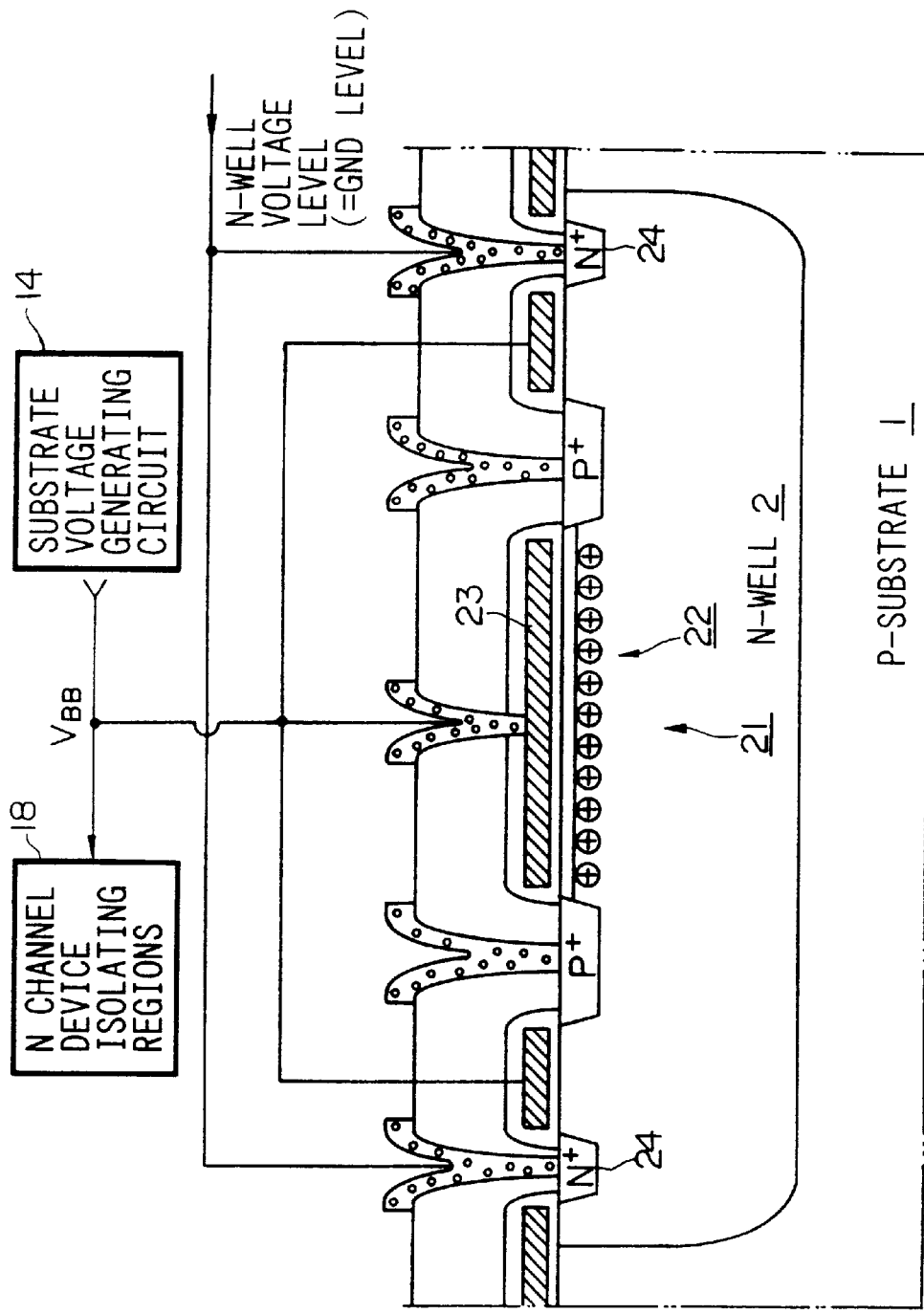
FIG. 3 shows a section view of a MOS capacitor device used in the second preferred embodiment.

FIG. 3 shows a sectional view of a capacitor device 21 which is provided in the voltage regulating circuit 14. The capacitor device 21 is provided on a region except for the device isolating regions. The capacitor device 21 is made up of a MOSFET 22 having a gate electrode 23 which faces the N-well 2. The structure of the MOSFET 22 is substantially the same as that of the field shield MOS devices 15. However, the area of the gate electrode 23 of the MOSFET 22 is larger than the area of the gate electrode of the field shield MOS devices 15. An $N^+$-diffusion region 24 is formed in the N-well 2 so as to surround the MOSFET 22. The role of the $N^+$-diffusion region 24 is to fix the level of the N-well 2.

The voltage $V_{BB}$ outputted by the substrate voltage generating circuit 14 is supplied to the gate electrode 23. The GND level is supplied to the $N^+$-diffusion region 24 and the voltage level of the N-well 2 is to fixed at the GND level by the $N^+$-diffusion region 24. As a result, a gate bias is given to a gate oxide film between the gate electrode 23 and the N-well 2, and electric carriers are induced and accumulated in the surface of the N-well 2. In this manner, the MOSFET 22 acts as a MOS capacitor.

Furthermore, a circuit for regulating the P-substrate is connected the pumped voltage generating circuit 13. The configuration of this circuit is substantially identical to that of the circuit shown in FIGS. 2 and 3. Therefore, the description is omitted.

Third Preferred Embodiment

If a plurality of circuit blocks is provided on the semiconductor integrated circuit device 12, not all the isolating performances which are required for the circuit blocks are the same. Therefore, it is preferable to generate a plurality of voltages, and to select the voltages which are suitable for the circuit blocks, and to supply the selected voltages to the field shield electrodes provided on the circuit blocks.

Figure 4:
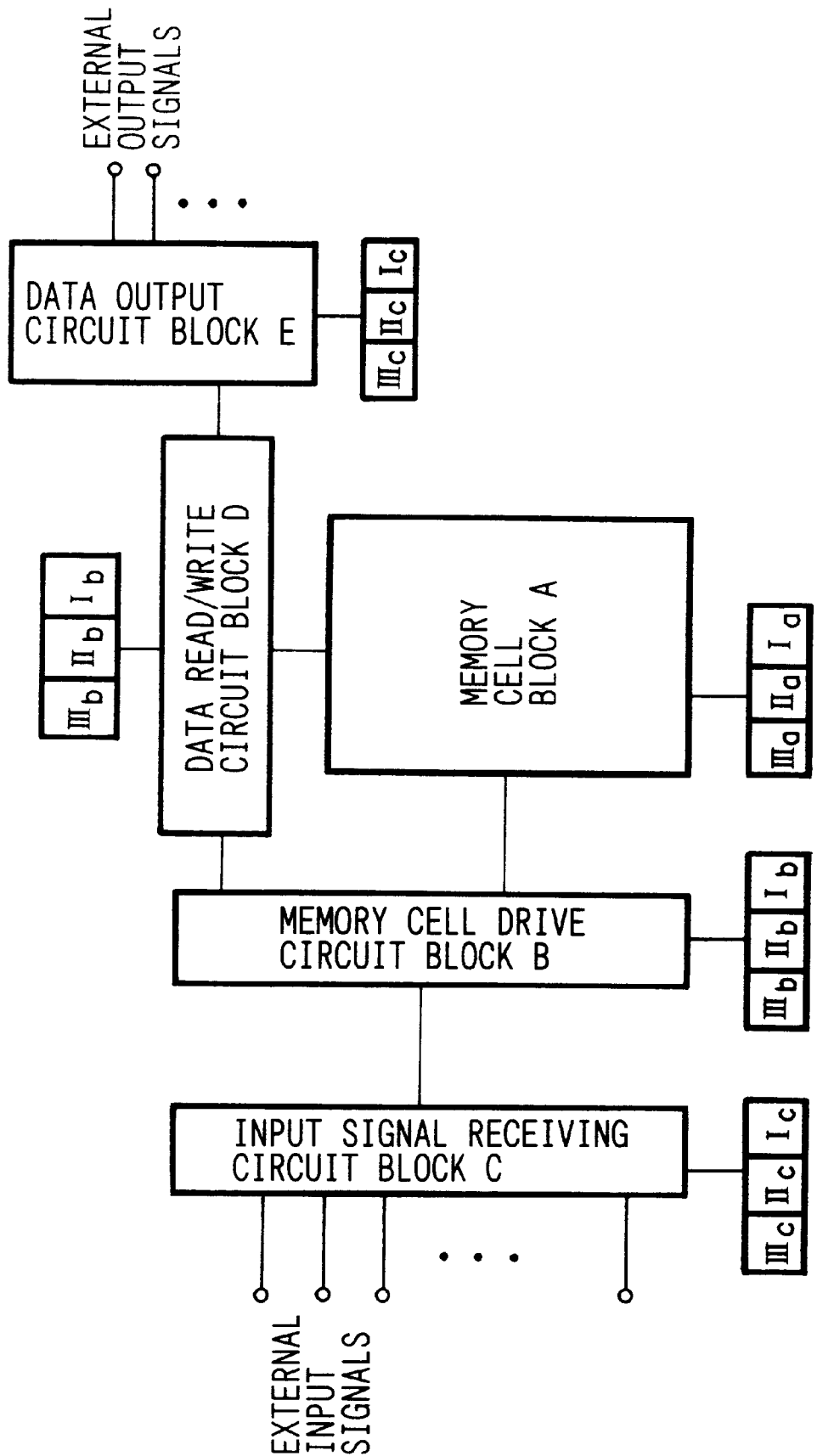
FIG. 4 shows a circuit configuration of a third preferred embodiment of the present invention.

FIG. 4 shows a example of circuit blocks which are provided on the semiconductor integrated circuit device 12 of the preferred embodiment. As shown in FIG. 4, a memory cell block A, and a memory cell drive circuit block B, and an input signal receiving circuit block C, and a date read/write circuit block D, and a data output circuit block E are provided on the semiconductor integrated circuit device 12.

The memory cell block A has a large number of memory cells for storing electronic carriers. Therefore, a large amount of electronic carrier may be accumulated in a region of the surface of the substrate in which the memory cell block A is formed. Accordingly, it is effective to improve the device isolation performance of the memory cell block A in order to reduce the consumption of current.

The input signal receiving circuit C is directly connected to external signal input terminals. Therefore, external signals, the waveforms of which have an over-shoot and an under-shoot are given to the input signal receiving circuit block C. Accordingly, it is necessary to sufficiently isolate the devices of the input signal receiving circuit block C so that electric currents due to the over-shoot and the under-shoot are not generated. Therefore, it is necessary to make the pumped voltage $V_{DD}+\alpha$ and the absolute value of the negative voltage GND-β high.

In the data read/write circuit block D, when data are read out from the memory cells and outputted on the data lines, the signal waveforms on the data lines are equalized and the over-shoot or the under-shoot of the signal waveforms are small in most cases. Therefore, the pumped voltage $V_{DD}+\alpha$ and the absolute value of the negative voltage GND-$\beta$ may be comparatively low.

Figure 5:
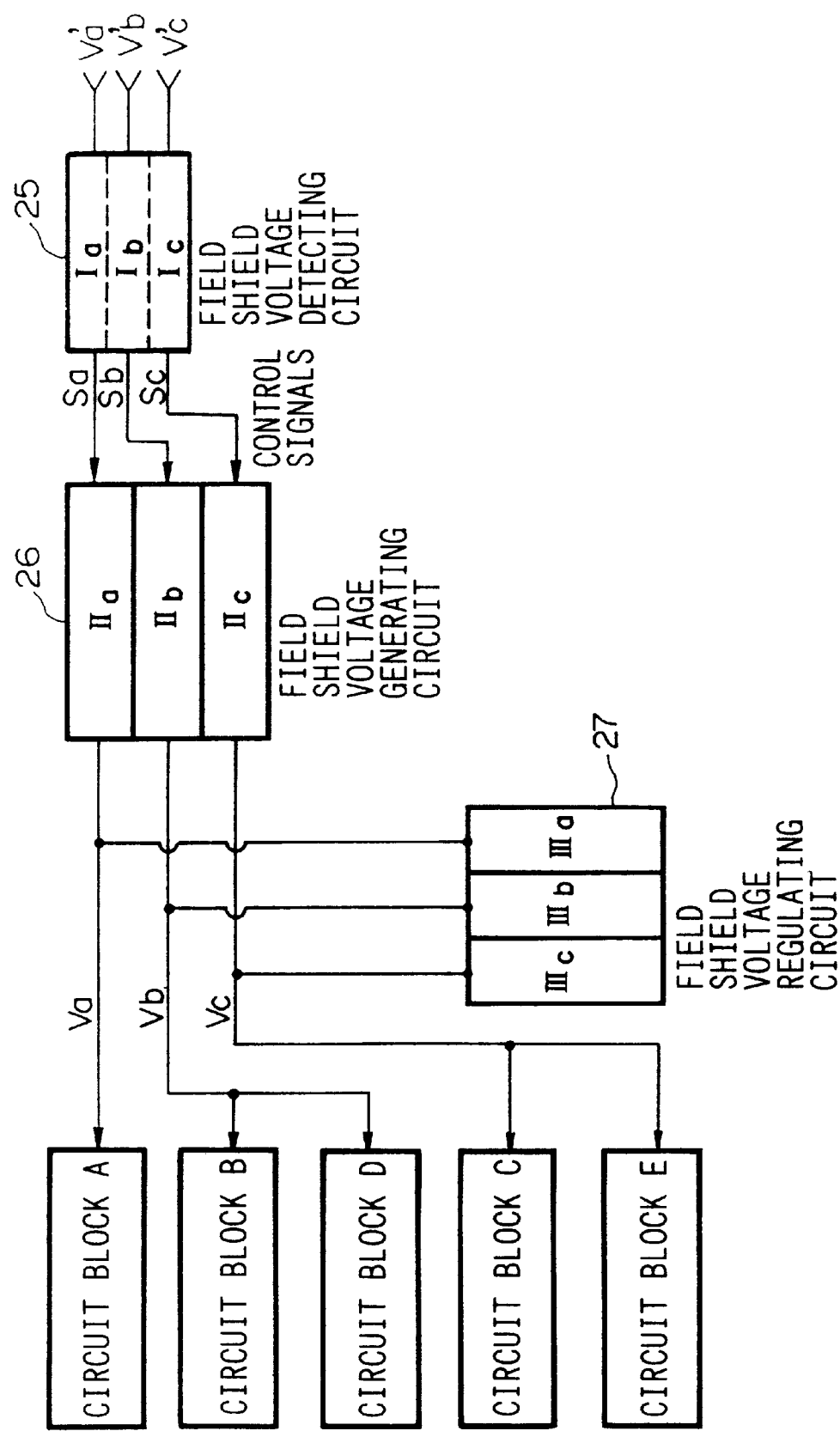
FIG. 5 shows a configuration of a circuit for electrically isolating active transistors of circuit blocks of the third preferred embodiment.

According to the consideration above, suitable voltages for device isolation are selected and the voltages thus selected are supplied to the circuit blocks A~E by a circuit configuration shown in FIG. 5.

In the preferred embodiment, a field shield electrode voltage detecting circuit 25, and a field shield voltage generating circuit 26, and a field shield voltage regulating circuit 27 are provided on the semiconductor integrated circuit device.

The field shield voltage generating circuit 26 has three circuit blocks IIa~IIc which respectively generate field shield voltages Va, Vb, and Vc.

The field shield voltages Va, Vb, and Vc are respectively regulated by circuit blocks IIIa, IIIb, and IIIc of the field shield voltage regulating circuit 27.

The field shield voltage Va thus regulated is supplied to the circuit block A. The field shield voltage Vb thus regulated is supplied to the circuit blocks B and D. The field shield voltage Vc thus regulated is supplied to the circuit blocks C and E.

The field shield voltages thus supplied are used for fixing the level of the field shield electrodes and the level of the N-well or the P-substrate in the respective circuit blocks.

The operations of the circuit blocks exert influences to the field shield voltages. The field shield voltages Va', Vb', and Vc', which are actually supplied to the circuit blocks, are respectively detected by circuit blocks Ia, Ib, and Ic of the field shield voltage detecting circuit 25. The circuit blocks Ia, Ib, and Ic respectively output control signals Sa, Sb, and Sc which respectively indicate the concrete field shield voltages Va', Vb', and Vc'.

The voltages Va, Vb, and Vc outputted by the field shield voltage generating circuit 26 are controlled based on the control signals Sa, Sb, and Sc so that the voltages remain constant.

Advantages of the Preferred Embodiments

The advantages of the preferred embodiments as described above are as follows:

Advantages of First Preferred Embodiment (1) The absolute values of the upper and lower limits of the voltage levels of the source or drain diffusion regions can be enhanced. A sufficient margin can be provided between the upper peak level of the signal generated in the semiconductor integrated circuit device 12 and the upper limit and between the lower peak level of the signal and the lower limit. Therefore, even if signals having an over-shoot or an under-shoot are generated in the circuit on the semiconductor integrated circuit device 12, the field shield MOS devices 15 and 16 are not changed to an ON-state. Therefore, the devices of the circuit are sufficiently isolated. It is not necessary to make the gate oxide of the field shield MOSFET thick in order to enhance the threshold voltages of the field shield voltages. Therefore, the technique of the preferred embodiment is suitable for large-scaled integrated circuits having a higher device density.

(2) The leakage currents of the field shield MOS devices are reduced. Therefore, the consumption of current by the semiconductor device can be reduced. In the case of DRAMs, it is not necessary to rapidly refresh the memory cells at a higher frequency in order to prevent the loss of the stored information.

(3) In semiconductor memories such as DRAMs, voltage generating circuits are provided for supplying the substrate voltage and for driving the word lines of the memory cells. In the preferred embodiment, the output voltages of these voltage generating circuits are also supplied to the field shield electrodes in order to isolate the active transistors. Therefore, it is not necessary to provide a special voltage generating circuit to generate voltages for the device isolation. The voltage generating circuits and the field shield are connected by conductive lines. The roles of the lines are to supply the voltages to the field shield electrodes. It is not necessary to flow currents through the lines. The voltage generating circuits and the field shield electrodes may be easily wired by thin conductive lines. Therefore, the layout design of the semiconductor integrated circuit device 12 becomes easy.

(4) The voltage $V_{BB}$ is generated by the substrate voltage generating circuit 14. The voltage $V_{BB}$ is supplied to the P-substrate 1 and to the field shield electrodes 10. There is no voltage between the field shield electrodes 10 and the P-substrate 1. Therefore, a leakage current which flows through the field oxide film between the field shield electrodes and the surface of the P-substrate 1 can be prevented.

Advantages of Second Preferred Embodiment (1) The voltage regulating circuit is inserted between the voltage generating circuit 13 or 14 and the device isolating region 17 or 18 for regulating the voltage of the field shield region. If the circuit provided on the semiconductor integrated circuit device 12 operates at a higher frequency and there is no countermeasure, the switching operation of the transistors of the circuit will exert deleterious effects on the voltage of the field shield region. However, the variation of the voltage of the field shield region is regulated by the voltage regulating circuit in the preferred embodiment. Therefore, the influence due to the switching operation of the circuit is reduced. In particular, the technique of the preferred embodiment is effective for semiconductor devices which have a higher device density and operate at a high frequency.

(2) The MOS capacitor is used as the capacitor device 21 of the voltage regulating circuit 20. The structure of the MOS capacitor is the same as that of the field shield MOSFET 15 or 16. Therefore, the MOS capacitor and the field shield MOSFET can be produced through similar processing steps. It is not necessary to add a new processing step to provide the MOS capacitor. The MOS capacitor is provided on a remainder region which is not used for the device isolating regions 17 and 18. Therefore, it is not necessary to secure a special region to provide the MOS capacitor. The MOS capacitor having a large area can be provided on the semiconductor integrated circuit device 12. Therefore, it is possible to make the capacity of the MOS capacitor sufficiently high.

Advantages of Third Preferred Embodiment

If a plurality of circuit blocks are provided on the semiconductor integrated circuit device 12, the device isolating performances required for the circuit blocks are not the all same. If the devices of all the circuit blocks are to be uniformly isolated by using a same field shield voltage, the field shield voltage should be determined so as to sufficiently isolate the devices included in the circuit block which requires the maximum isolating performance. However, there are circuit blocks which do not require such a powerful isolation performance. In these circuit blocks, the voltage level of the N-well is pumped to a higher level which is more than the level which is required for isolating the devices. As a result, the drain currents of the active MOSFETs of the circuit blocks are increased and the electrical power is wasted. In the preferred embodiment, a plurality of field shield voltages are generated and the suitable field shield voltages are supplied to the circuit blocks. Therefore, the devices of the circuit blocks are effectively isolated without an increase in power consumption. Furthermore, the whole circuit of the semiconductor device is separated into a plurality of circuit blocks and the device isolations are independently carried out on the devices of the circuit blocks. Therefore, noise propagation between the different circuit blocks is prevented.

Modification of Preferred Embodiments

The present invention is not limited to the preferred embodiments described above. Variations may be made according to the technical feature of the present invention, for example, as follows.

(1) In the above described preferred embodiments, the field shield voltages are generated by the pumped voltage generating circuit 13 and the substrate voltage generating circuit 14, which are conventional circuits provided on DRAMs. However, a new voltage generating circuit may be provided on the semiconductor integrated circuit device for generating the field shield voltages.

Figure 6:
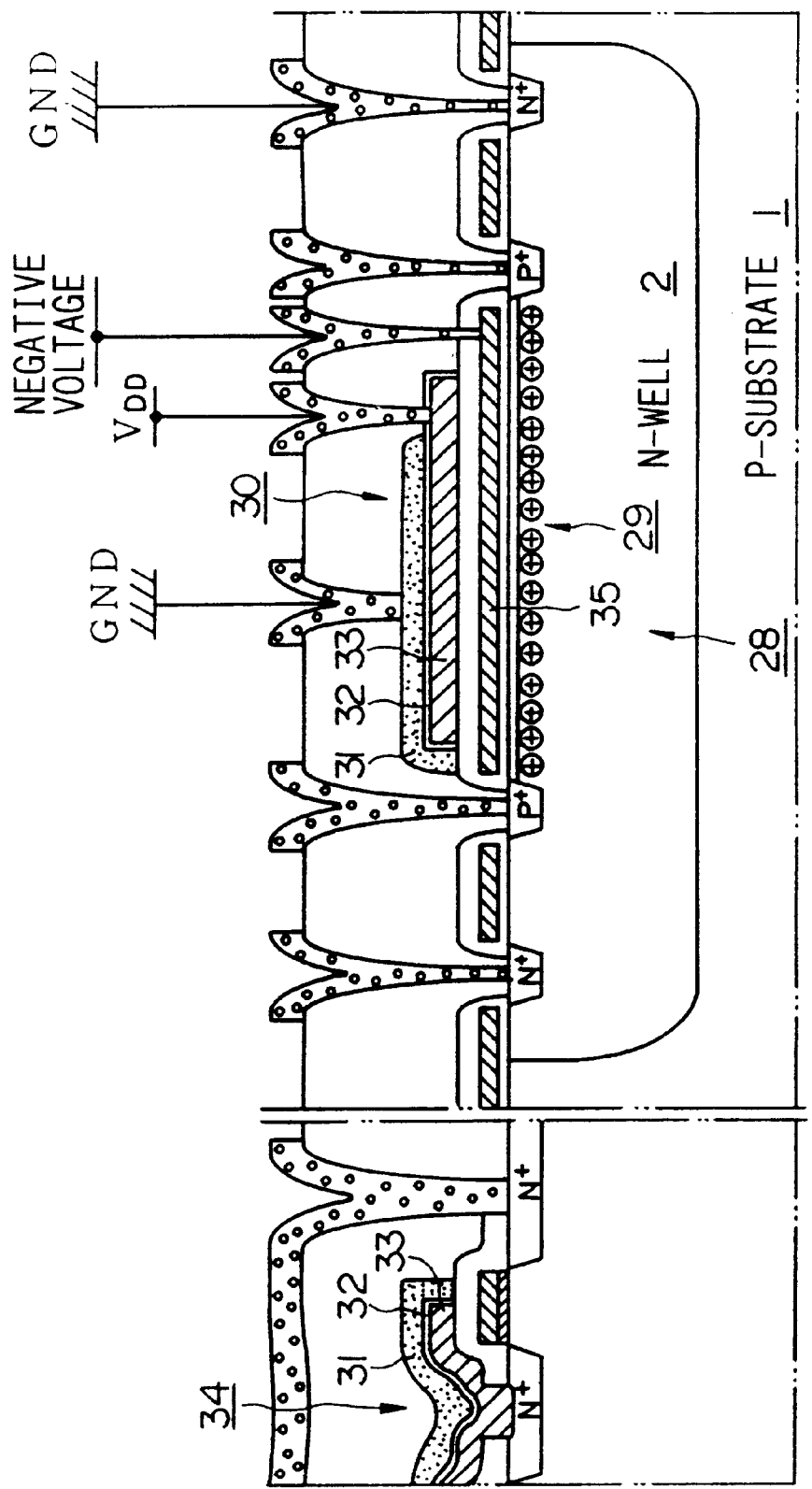
FIG. 6 shows a section view of an another type of capacitor device.

(2) A capacitor device shown in FIG. 6 may be used instead of the capacitor device 22 shown in FIG. 3.

In FIG. 6, a capacitor 28 has a MOS device 29 having a structure which is the same as the structure shown in FIG. 3 and a MOS capacitor 30 which is laid upon the MOS device 29. The MOS capacitor 30 has layers 33, 32, and 31 which respectively correspond to a storage node electrode 33, an insulating film 32, and a cell-plate electrode 31 of a memory-cell capacitor 34. That is to say, the MOS capacitor 30 and the memory-cell capacitor 34 are obtained through the same processing steps. Therefore, it is not necessary to add a special processing step to the original process in order to produce the MOS capacitor 34.

A negative voltage, a $V_{DD}$ voltage, and a GND voltage are respectively supplied to the electrode 35 of the MOS device 35, the lower electrode 33 of the MOS capacitor 30, and the upper electrode 31 of the MOS capacitor 30. The total capacity of the capacitor device 28 is a sum of the capacitors of the MOS device 29 and of the MOS capacitor 30. Therefore, a large capacity is obtained from the capacitor device 28.

(3) In the third preferred embodiment described above, the circuit blocks are divided into three groups and the device isolation of the groups are carried out based on the field shield voltages Va, Vb, and Vc. It is necessary to provide the field shield voltage detecting circuits, the field shield voltage generating circuit, and the field shield voltage regulating circuits for all the groups. Therefore, the number of groups should be determined considering a balance between the reduction of power consumption and the production cost of the semiconductor integrated circuit.

(4) The above-described preferred embodiment discloses an example of the structure of a DRAM provided according to the technical feature of the present invention. However, a range of the application of the present invention is not limited to DRAMs. The present invention can be applied to various types of semiconductor integrated circuit devices such as other types of memory devices, logic LSIs, and microcomputer LSIs. The device technology of the semiconductor integrated circuit is not limited to the CMOS device. The present invention may be applied to the device isolation of PMOS devices, and of NMOS devices.

What is claimed is:

1. A semiconductor integrated circuit device, comprising:
a semiconductor substrate;
P-channel and N-channel active transistors respectively formed in the semiconductor substrate and having respective impurity diffusion regions; and
field shield MOS devices having field shield electrodes respectively formed upon a region of the substrate between the respective impurity diffusion regions of the P-channel and N-channel active transistors;
wherein field shield voltages are respectively supplied to the respective field shield electrodes to turn the respective field shield MOS devices to an OFF-state to electrically isolate the respective P-channel and N-channel active transistors;
said semiconductor integrated circuit device further comprising:
a plurality of circuit blocks which have the P-channel and N-channel active transistors to be isolated and the respective field shield MOS devices; and
field shield voltage generating means for respectively generating field shield voltages having different voltage levels, which are supplied to the respective field shield electrodes of the respective field shield MOS devices of one or more of the plurality circuit blocks to electrically isolate the P-channel and N-channel active transistors of the circuit blocks;
wherein different voltage levels are supplied to the plurality of circuit blocks having the same conductivity type channel active transistors.

2. A semiconductor integrated circuit device, comprising:
a semiconductor substrate;
P-channel active MOSFETs formed in the semiconductor substrate and having impurity diffusion regions;
N-channel active MOSFETs formed in the semiconductor substrate and having impurity diffusion regions;
P-channel field shield MOS devices for electrically isolating the P-channel active MOSFETS, the P-channel field shield MOS devices having field shield electrodes formed on regions between the impurity diffusion regions of the P-channel active MOSFETS; and
N-channel field shield MOS devices for electrically isolating the N-channel active MOSFETS, the N-channel field shield MOS devices having field shield electrodes formed on regions between the impurity diffusion-regions of N-channel active MOSFETS;
wherein a P-channel field shield voltage, which is higher than a power supply voltage of the semiconductor integrated circuit, is supplied to the field shield electrodes of the P-channel field shield MOS device to turn the P-channel field shield MOS devices to an OFF-state to electrically isolate the P-channel active MOSFETS, and
an N-channel field shield voltage, which is lower than a ground level of the semiconductor integrated circuit, is supplied to the field shield electrodes of the N-channel field shield MOS devices to turn the N-channel field shield MOS devices to an OFF-state to electrically isolate the N-channel active MOSFETS.

3. The semiconductor integrated circuit device according to claim 2, further comprising:
a pumped voltage generating circuit for supplying a pumped voltage higher than the cower supply voltage to the P-channel or N-channel active MOSFETs as a bias voltage; and
a negative voltage generating circuit for supplying a negative voltage lower than the ground level to the P-channel or N-channel active MOSFETs as a bias voltage;
wherein the pumped voltage is used as the P-channel field shield voltage and the negative voltage is used as the N-channel field shield voltage.

4. The semiconductor integrated circuit device according to claim 3, wherein the negative voltage generating circuit is a substrate voltage generating circuit which supplies a substrate voltage to the semiconductor substrate.

5. A semiconductor integrated circuit device, comprising:

a semiconductor substrate;

active transistors formed in the semiconductor substrate and having impurity diffusion regions; and field shield MOS devices having field shield electrodes formed upon a region of the substrate between the impurity diffusion regions of the active transistors;

wherein a field shield voltage is supplied to the field shield electrodes to turn the field shield MOS devices to an OFF-state to electrically isolate the active transistors, and the voltage level of the field shield electrodes are of a higher voltage than an operation voltage of the active transistors.

6. The semiconductor integrated circuit device according to claim 5, further comprising:

voltage regulating means for regulating the field shield voltage.

7. A semiconductor integrated circuit device, comprising:

a semiconductor substrate;

active transistors formed in the semiconductor substrate and having impurity diffusion regions; and field shield MOS devices having field shield electrodes formed upon a region of the substrate between the impurity diffusion regions of the active transistors;

wherein a field shield voltage is supplied to the field shield electrodes to turn the field shield MOS devices to an OFF-state to electrically isolate the active transistors, and the voltage level of the field shield electrodes is shifted from a range of an operation voltage of the active transistors;

said semiconductor integrated circuit device, further comprising:

a plurality of circuit blocks which have the active transistors to be isolated and the field shield MOS devices; and field shield voltage generating means for generating field shield voltages having different voltage levels, which are supplied to the field shield electrodes of the field shield MOS devices of one or more of the plurality circuit blocks to electrically isolate the active transistors of the circuit blocks; and wherein different voltage levels are supplied to the plurality of circuit blocks having the same conductivity type channel active transistors.

* * * * *